(12) United States Patent
Lee et al.

(10) Patent No.: US 10,460,808 B2
(45) Date of Patent: Oct. 29, 2019

(54) MEMORY DEVICE AND PROGRAMMING OPERATION METHOD THEREOF WITH DIFFERENT BIT LINE VOLTAGES

(71) Applicant: MACRONIX INTERNATIONAL CO., LTD., Hsinchu (TW)

(72) Inventors: Ya-Jui Lee, Taichung (TW); Kuan-Fu Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 6 days.

(21) Appl. No.: 15/793,045

(22) Filed: Oct. 25, 2017

(65) Prior Publication Data
US 2019/0122735 A1    Apr. 25, 2019

(51) Int. Cl.
G11C 16/08     (2006.01)
G11C 16/24     (2006.01)
G11C 16/12     (2006.01)
G11C 16/14     (2006.01)

(52) U.S. Cl.
CPC .............. *G11C 16/08* (2013.01); *G11C 16/12* (2013.01); *G11C 16/14* (2013.01); *G11C 16/24* (2013.01)

(58) Field of Classification Search
None
See application file for complete search history.

(56) References Cited

U.S. PATENT DOCUMENTS

| | | | |
|---|---|---|---|
| 2008/0239824 A1* | 10/2008 | Sekar | G11C 16/0483 |
| | | | 365/185.19 |
| 2008/0310222 A1* | 12/2008 | Roohparvar | G11C 11/5621 |
| | | | 365/185.03 |
| 2009/0080265 A1 | 3/2009 | Mokhlesi et al. | |
| 2010/0020618 A1* | 1/2010 | Kim | G11C 7/12 |
| | | | 365/185.23 |
| 2010/0165743 A1* | 7/2010 | Cernea | G11C 16/26 |
| | | | 365/185.21 |
| 2010/0329005 A1 | 12/2010 | Yang | |
| 2012/0099387 A1 | 4/2012 | Shim et al. | |
| 2014/0160846 A1 | 6/2014 | Lee et al. | |
| 2016/0027512 A1 | 1/2016 | Hagishima et al. | |
| 2017/0076818 A1 | 3/2017 | Abedifard et al. | |

* cited by examiner

*Primary Examiner* — J. H. Hur
(74) *Attorney, Agent, or Firm* — McClure, Qualey & Rodack, LLP

(57) ABSTRACT

Provided is an operation method for a memory device. The memory device includes a memory array having a plurality of word lines and a plurality of bit lines. The operation method for the memory device includes: applying a program voltage to at least one selected word line of the word lines; and during a high level of the program voltage, based on respective locations of a plurality of selected bit line, which are to be written into data 0, on the word lines, applying different plurality of bit line voltages to the selected bit line which are to be written into data 0.

13 Claims, 4 Drawing Sheets

MEMORY DEVICE AND PROGRAMMING OPERATION METHOD THEREOF WITH DIFFERENT BIT LINE VOLTAGES

TECHNICAL FIELD

The disclosure relates in general to a memory device and an operation method thereof.

BACKGROUND

In memory device, when electrical signal are transmitted, RC (resistance-capacitance) delay time is inevitable. If the word lines are longer, the RC delay time may be severer. The word line voltage is applied at the head of the word lines. Due to RC delay, the end of the word lines may receive distorted word line voltage. This may result in the large programming speed difference between the memory cells at the head of the word lines and the memory cells at the end of the word lines. Thus, the dumb program Vth distribution may be wide, which will negatively influence the performance of the memory device. In order to raise voltage at the end of the word lines, a large program pulse width is needed. However, this will also worsen cell program performance. The application discloses a memory device and an operation method thereof to solve the large programming speed difference between the memory cells at the head of the word lines and the memory cells at the end of the word lines due to RC delay time. The dumb program Vth distribution may be narrowed and the performance of the memory device may be improved.

SUMMARY

According to one embodiment, provided is an operation method for a memory device having a memory array including a plurality of word lines and a plurality of bit lines. The operation method for the memory device includes: applying a program voltage to at least a selected word line of the word lines; and during a high level period of the program voltage, based on respective locations of a plurality of selected bit lines, which are to be written data 0, of the bit lines on the word lines, applying a plurality of different bit line voltages to the selected bit lines which are to be written data 0.

According to another embodiment, provided is an operation method for a memory device having a memory array including a plurality of word lines and a plurality of bit lines. The bit lines are grouped into a plurality of bit line groups based on respective locations of the bit lines on the word lines. The operation method for the memory device includes: applying a program voltage to at least a selected word line of the word lines; and during a high level period of the program voltage, applying a plurality of different bit line voltages to the bit lines groups.

According to an alternative embodiment, provided is a memory device including: a memory array including a plurality of word lines and a plurality of bit lines; a control circuit coupled to the memory array; and an operation voltage generation circuit, coupled to the memory array and the control circuit, for generating a program voltage to at least a selected word line of the word lines of the memory array. Under control of the control circuit, during a high level period of the program voltage, based on respective locations of a plurality of selected bit lines, which are to be written data 0, of the bit lines on the word lines, the operation voltage generation circuit applies a plurality of different bit line voltages to the selected bit lines which are to be written data 0.

Figure 1A:
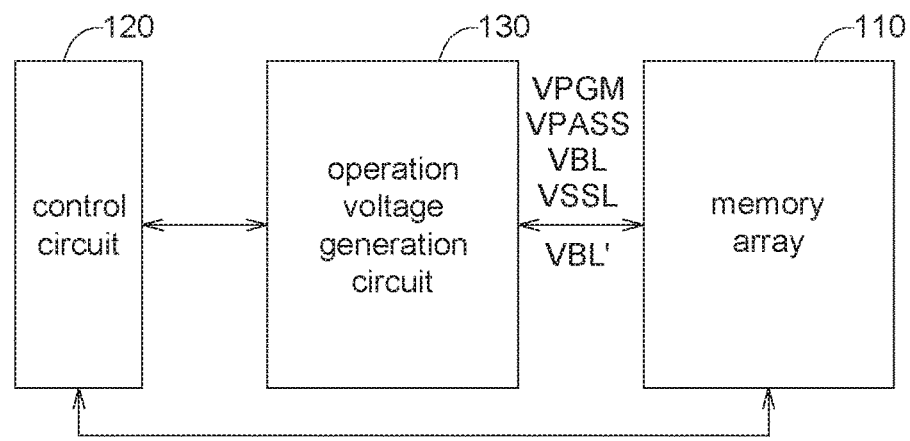
FIG. 1A shows a functional block diagram of a memory device according to an embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1A shows a functional block diagram of a memory device 100 according to an embodiment of the application. The memory device 100 includes a memory array 110, a control circuit 120 and an operation voltage generation circuit 130. The memory array 110 includes a plurality of memory cells (not shown) arranged in an array. The control circuit 120 is coupled to the memory array 110 and the operation voltage generation circuit 130. The control circuit 120 controls operations on the memory array 110, for example but not limited by, read, e and erase. The control circuit 120 controls the operation voltage generation circuit 130 to generate a program voltage VPGM, a bypass voltage VPASS, bit line voltages VBL and VBL' and a string selection voltage VSSL to the memory array 110. The functions of the program voltage VPGM, the bypass voltage VPASS, the bit line voltages VBL and VBL' and the string selection voltage VSSL will be described later.

Figure 1B:
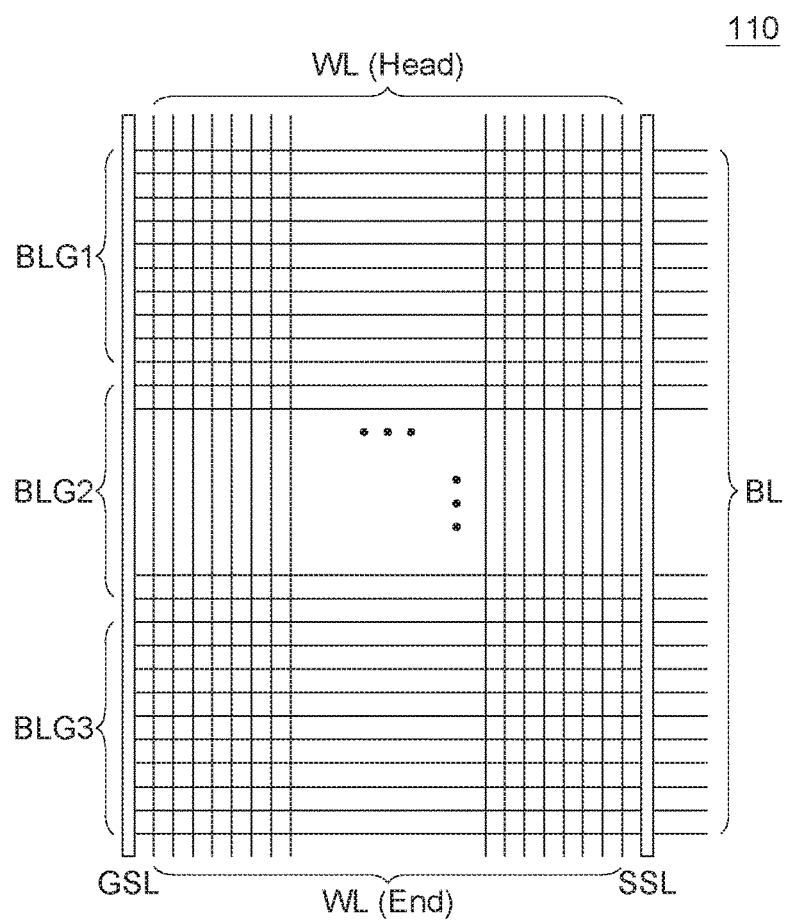
FIG. 1B shows a diagram of a memory array according to an embodiment of the application.

FIG. 1B shows a diagram of the memory array 110 according to an embodiment of the application. The memory array 110 includes a plurality of word lines WL and a plurality of bit lines BL. The memory cells are located at the intersections of the word lines WL and the bit lines BL.

In the embodiment of the application, the bit lines BL are grouped into a plurality of bit line groups. For example, in FIG. 1B, based on the locations of the bit lines BL on the word lines WL, the bit lines BL are grouped into three bit line groups BLG1, BLG2 and BLG3. The bit line group BLG1 is at the head of the word lines WL. The bit line group BLG2 is at the middle of the word lines WL. The bit line group BLG3 is at the end of the word lines WL. In here, voltages applied to the word line are received at the head of the word lines WL, and then sent to the middle and the end of the word lines WL. Therefore, the end of the word lines WL is suffered by the worst RC delay.

Besides, respective switch elements are disposed at two terminals of each of the bit lines BL, for deciding whether the bit line BL is selected. For example, as shown in FIG. 1B, one switch element (for example, a MOS transistor) is at the left terminal of the bit line BL, and a control terminal (for example a gate of the MOS transistor) of the switch element is coupled to the ground selected line GSL. The other switch element (for example, a MOS transistor) is at the right terminal of the bit line BL, and a control terminal (for example a gate of the MOS transistor) of the switch element is coupled to the string selected line SSL. In other words, in FIG. 1B, the memory cells are disposed at intersections of the word lines WL and the bit lines BL, the switch element (which is not as the memory cell) is disposed at intersections of the ground selected line GSL and the bit lines BL, and the switch element (which is not as the memory cell) is disposed at intersections of the string selected line SSL and the bit lines BL.

Figure 2:
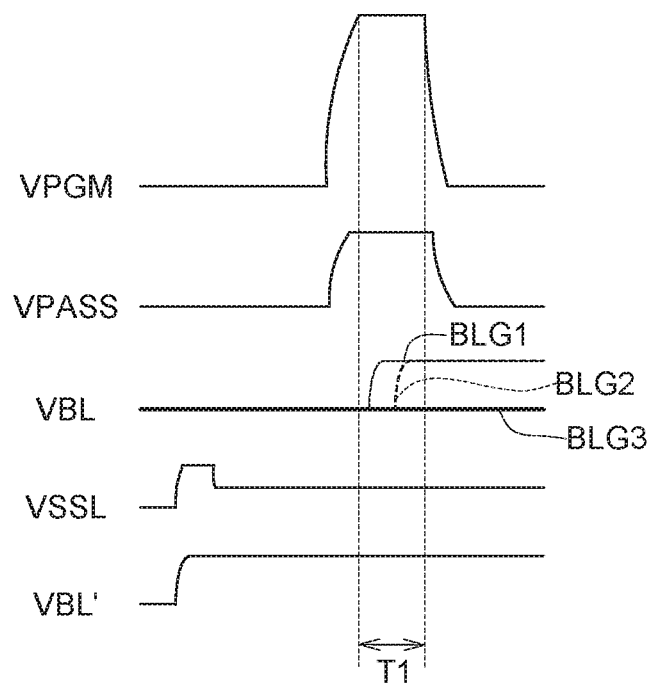
FIG. 2 shows a signal waveform diagram according to an embodiment of the application.

FIG. 2 shows a signal waveform diagram according to an embodiment of the application. The program voltage VPGM is applied to the selected word line WL. The bypass voltage VPASS is applied to the unselected word line WL. The bit line voltage VBL is applied to the selected bit lines which are to be written logic 0. The bit line voltage VBL' is applied to the unselected bit lines or the selected bit lines which are to be written logic 1.

In details, when the program voltage VPGM is transited to high level, the selected word line WL is programmed. For program operation, the string selection voltage VSSL is transited from 0V to high level for pre-charging and then dropped to an intermediate level (but higher than 0V). The intermediate level of the string selection voltage VSSL will meet the following requirements that: (1) 0V is allowed to be continuously sent to the selected bit lines BL which are to be written logic 0 for programming; and (2) the switch elements of the unselected bit lines or the selected bit lines, which are to be written logic 1, are turned off to float the gate terminals of the transistors of the memory cells on the unselected bit lines or the selected bit lines which are to be written logic 1, and after the pass voltage VPASS is pulled up, the cell string are also pulled up due to capacitor coupling effect.

The bit line voltage VBL is applied to the selected bit lines which are to be written logic 0. The bit line voltage VBL' is applied to the unselected bit lines or the selected bit lines which are to be written logic 1. As shown in FIG. 2, the bit line voltage VBL' is pulled up from low level to high level (for example but not limited by VDD (2.4V)).

In the embodiment of the application, as shown in FIG. 2, in the high level period (T1) of the program voltage VPGM, based on the locations of the selected bit lines BL, which are to be written logic 0, on the word lines WL, different waveforms of the bit line voltage VBL are applied. In T1, the bit line voltage VBL of the selected bit lines BL closer to the head of the word lines WL will be transited to the high level earlier (in here, the timing when the bit line voltage VBL is transited to the high level is also referred as "high level transition time"). The bit lines BL of the bit line group BLG1 are closest to the head of the word lines, and the bit line voltage VBL of the selected bit lines BL of the bit line group BLG1 are the earliest transited to the high level, wherein in the bit line group BLG1, some bit lines are selected to be written into logic 0, other bit lines are unselected and other bit lines are selected to be written into logic 1. Similarly, the bit lines BL of the bit line group BLG2 are second closest to the head of the word lines, and the bit line voltage VBL of the selected bit lines BL of the bit line group BLG2 are second earliest transited to the high level. The bit lines BL of the bit line group BLG3 are most far from the head of the word lines, and the bit line voltage VBL of the selected bit lines BL of the bit line group BLG3 is substantially kept at low level (0V).

As known, in the memory device, due to RC delay effect of the word lines, the memory cells close to the head of the word lines WL may receive the high level (for example but not limited by 20V) of the program voltage VPGM for a longer time period (for example but not limited by 10 μs) and thus have high program speed. On the contrary, the memory cells close to the end of the word lines WL may receive the high level of the program voltage VPGM for a shorter time period (for example but not limited by 2-3 μs) and thus have low program speed. In the memory device, if the program speed difference between the memory cells is large, then the dumb program Vth distribution may be wide which will degrade the performance of the memory device.

Therefore, in the embodiment of the application, the respective high level of the respective bit line voltage VBL are adjusted based on the locations of the bit lines on the word lines, and thus the program speed between the memory cells are approximately similar. That is, the memory cells close to the head of the word lines and the memory cells close to the end of the word lines have similar program speed. By so, the dumb program Vth distribution is narrowed and the performance of the memory device is improved.

Besides, the program speed of the memory cells is related to the tunnel oxide across voltage between the floating gate and the bit line voltage (the tunnel oxide across voltage is equal to the difference the floating gate and the bit line voltage). If the tunnel oxide across voltage is higher, then the program speed of the memory cells is faster and vice versa.

Thus, in the embodiment of the application, the memory cells of the bit lines close to the head of the word lines WL is transited to the high level earlier, and thus the tunnel oxide across voltage of the memory cells close to the head of the word lines WL is decreased earlier to decrease the program speed of the memory cells close to the head of the word lines WL. Thus, the memory cells have the approximate program speed to reduce the RC delay effect.

Figure 3A:
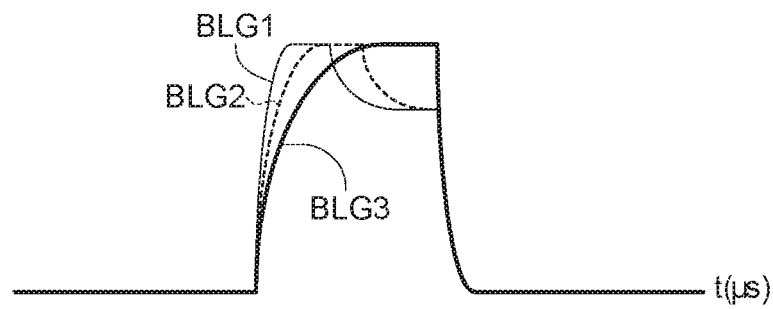
FIG. 3A shows waveform diagram of a tunnel oxide across voltage according to an embodiment of the application.

FIG. 3A shows waveform diagram of the tunnel oxide across voltage according to an embodiment of the application. As shown in FIG. 3A, in the embodiment of the application, because the bit lines (i.e. the bit line group BLG1) close to the head of the word lines WL is pulled to the high level earlier, the tunnel oxide across voltage of the memory cells close to the head of the word lines WL is decreased earlier to decrease the program speed of the memory cells close to the head of the word lines WL. As known, the program speed is related to the integration area of the tunnel oxide across voltage. From FIG. 3A, the respective integration area of the tunnel oxide across voltage of the bit line groups BLG1, BLG2 and BLG3 are close. That is, the program speed of the bit line groups BLG1, BLG2 and BLG3 are close to each other. Thus, the dumb program Vth distribution is narrowed and the performance of the memory device is improved.

Figure 3B:
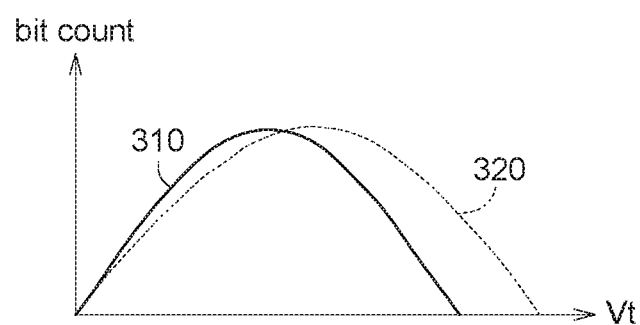
FIG. 3B shows respective dumb Vth program distribution of the embodiment of the application and the prior art.

FIG. 3B shows the respective dumb program Vth distribution of the embodiment of the application and the prior art. As shown in FIG. 3B, the dumb program Vth distribution 310 of the embodiment of the application is narrower than the prior dumb program Vth distribution 320. Thus, the memory device of the embodiment of the application has improved performance.

In summary, in the above embodiment of the application, the memory cells on the bit lines closest to the head of the word lines WL are pulled to the high level earliest, the memory cells on the bit lines second closest to the head of the word lines WL are pulled to the high level second earliest, and so on. The memory cells on the bit lines close to the end of the word lines WL are kept at low level (for example 0V). Thus, the memory cells have the similar program speed (that is, the memory cells close to the head of the word lines and the memory cells close to the end of the word lines have the similar program speed). By so, the dumb program Vth distribution is narrowed and the memory device has improved performance.

Figure 4:
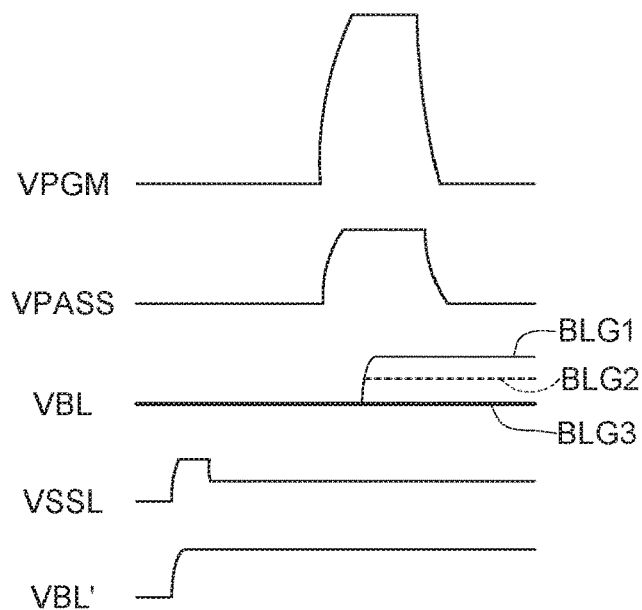
FIG. 4 and FIG. 5 show signal waveform diagrams according to another two embodiments of the application.

FIG. 4 shows signal waveform diagrams according to another embodiment of the application. In FIG. 4, in the high level period (T1) of the program voltage VPGM, based on the locations of the selected bit lines BL, which are to be written logic 0, on the word lines WL, different waveforms of the bit line voltage VBL are applied. In T1, the bit line voltage VBL of the selected bit lines BL closer to the head of the word lines WL will be transited to a higher level. The bit lines BL of the bit line group BLG1 are closest to the head of the word lines, and the bit line voltage VBL of the selected bit lines BL of the bit line group BLG1 is pulled up to the highest level to decrease the program speed of the memory cells in the bit line group BLG1 by a most degree. Similarly, the bit lines BL of the bit line group BLG2 are at the middle of the word lines, and the bit line voltage VBL of the selected bit lines BL of the bit line group BLG2 is pulled up to the second highest level to decrease the program speed of the memory cells in the bit line group BLG2 by a second most degree. The bit lines BL of the bit line group BLG3 are most far from the head of the word lines, and the bit line voltage VBL of the selected bit lines BL of the bit line group BLG3 is substantially kept at low level (0V).

Therefore, in the embodiment of the application, the program speed between the memory cells is approximately similar. That is, the memory cells close to the head of the word lines and the memory cells close to the end of the word lines have similar program speed. By so, the dumb program Vth distribution is narrowed and the performance of the memory device is improved.

Thus, in the embodiment of the application, the bit line voltage of the bit lines close to the head of the word lines WL is transited to the highest level, and thus the tunnel oxide across voltage of the memory cells close to the head of the word lines WL is mostly lowered to decrease the program speed of the memory cells close to the head of the word lines WL. Thus, the memory cells have the approximate program speed to reduce the RC delay effect.

Similarly, via waveforms in FIG. 4, the respective integration area of the tunnel oxide across voltages of the bit line groups BLG1, BLG2 and BLG3 are close. That is, the program speed of the bit line groups BLG1, BLG2 and BLG3 are close to each other. Thus, the dumb program Vth distribution is narrowed and the performance of the memory device is improved.

In summary, in the FIG. 4 embodiment of the application, the memory cells on the bit lines closest to the head of the word lines WL are pulled to the highest level, the memory cells on the bit lines second closest to the head of the word lines WL are pulled to the second highest level, and so on. The memory cells on the bit lines close to the end of the word lines WL are kept at low level (for example 0V). Thus, the memory cells have the similar program speed (that is, the memory cells close to the head of the word lines and the memory cells close to the end of the word lines have the similar program speed). By so, the dumb program Vth distribution is narrowed and the memory device has improved performance.

Figure 5:
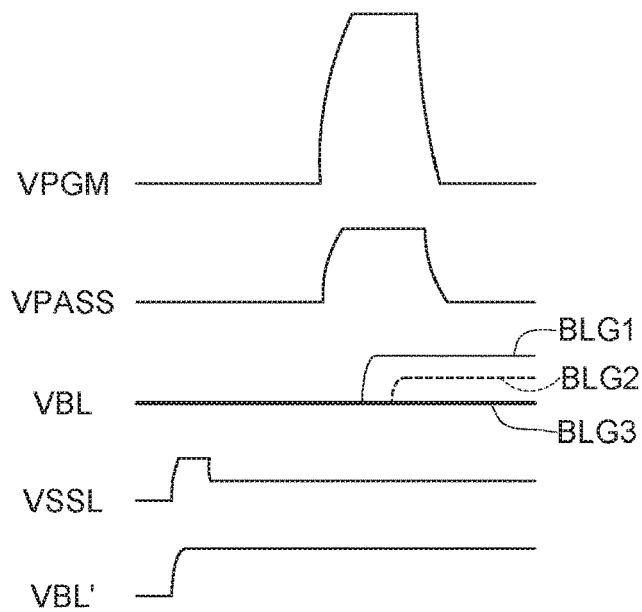

FIG. 5 shows signal waveform diagrams according to still another embodiment of the application. In FIG. 5, in the high level period (T1) of the program voltage VPGM, based on the locations of the selected bit lines BL, which are to be written data 0, on the word lines WL, different waveforms of the bit line voltage VBL are applied. In T1, the bit line voltage VBL of the selected bit lines BL closer to the head of the word lines WL will be earlier transited to a higher level. In details, the bit lines BL of the bit line group BLG1 are closest to the head of the word lines, and the bit line voltage VBL of the selected bit lines BL of the bit line group BLG1 is earliest pulled up to the highest level to decrease the program speed of the memory cells in the bit line group BLG1 by a most degree. Similarly, the bit lines BL of the bit line group BLG2 are at the middle of the word lines, and the bit line voltage VBL of the selected bit lines BL of the bit line group BLG2 is second earliest pulled up to the second highest level to decrease the program speed of the memory cells in the bit line group BLG2 by a second most degree. The bit lines BL of the bit line group BLG3 are most far from the head of the word lines, and the bit line voltage VBL of the selected bit lines BL of the bit line group BLG3 is substantially kept at low level (0V).

Therefore, in the embodiment of the application, the program speed between the memory cells is approximately similar. That is, the memory cells close to the head of the word lines and the memory cells close to the end of the word lines have similar program speed. By so, the dumb program Vth distribution is narrowed and the performance of the memory device is improved.

Thus, in the FIG. 5 embodiment of the application, the memory cells of the bit lines close to the head of the word lines WL is earliest transited to the highest level, and thus the tunnel oxide across voltage of the memory cells close to the head of the word lines WL is mostly lowered to decrease the program speed of the memory cells close to the head of the word lines WL. Thus, the memory cells have the approximate program speed to reduce the RC delay effect.

Similarly, via waveforms in FIG. 5, the respective integration area of the tunnel oxide across voltage of the bit line groups BLG1, BLG2 and BLG3 are close. That is, the program speed of the bit line groups BLG1, BLG2 and BLG3 are close to each other. Thus, the dumb program Vth distribution is narrowed and the performance of the memory device is improved.

In summary, in the FIG. 5 embodiment of the application, the memory cells on the bit lines closest to the head of the word lines WL are earliest pulled to the highest level, the memory cells on the bit lines second closest to the head of the word lines WL are second earliest pulled to the second highest level, and so on. The memory cells on the bit lines close to the end of the word lines WL are kept at low level (for example 0V). Thus, the memory cells have the similar program speed (that is, the memory cells close to the head of the word lines and the memory cells close to the end of the word lines have the similar program speed). By so, the dumb program Vth distribution is narrowed and the memory device has improved performance.

Further, in other possible embodiments of the application, there are other grouping implementations. For example, if the memory array includes 8k bit lines which are grouped into 4 groups. The grouping may be for example but not limited by, 2k-2k-2k-2k (each bit line group including 2k bit lines), or 4k-2k-1k-1k (the bit line closest to the head of the word lines including 4k bit lines, . . . and the bit line closest to the end of the word lines including 1k bit line), or 3k-1k-2k-2k (the bit line closest to the head of the word lines including 3k bit lines, . . . and the bit line closest to the end of the word lines including 2k bit lines). That is, each bit line group may include the same or different number of bit lines.

Still further, in other possible embodiments of the application, the memory array may have any number of the bit line group (even if each bit line group includes a bit line, i.e. the number of the bit line group is the same as the number of the bit line), which is still within the spirit of the application.

Besides, the high level of the bit line voltage VBL (which is applied to the selected bit line that are to be written logic 0) may be supplied by or implemented by any existing bias voltage source.

Besides, other possible embodiments of the application may be applied to QPW (quick pass write). For example, as for the selected bit line which are to be written logic 0, the bit line voltage VBL may be pulled up from Vqpw (for example, Vqpw=0.2V~1.2V) to VDD (when QPW is enabled).

Further, the respective high levels of the bit line voltages VBL (which are to be applied to the selected bit lines by writing logic 0) of the bit line groups may be equally distributed between VDD and 0V (assumed that the highest level of the bit line voltage VBL is VDD). For example, VDD is 2.4V. The high level of the bit line voltages VBL of the bit line group BLG1 is 1.6V, the high level of the bit line voltages VBL of the bit line group BLG2 is 1.6V/2=0.8V (for example) and the high level of the bit line voltages VBL of the bit line group BLG3 is 0V.

But in another possible embodiment of the application, the respective high levels of the bit line voltages VBL (which are to be applied to the selected bit lines by writing logic 0) of the bit line groups may be unequally distributed between VDD and 0V (assumed that the highest level of the bit line voltage VBL is VDD). For example, VDD is 2.4V. The high level of the bit line voltages VBL of the bit line group BLG1 is 1.6V, the high level of the bit line voltages VBL of the bit line group BLG2 is 1.1V and the high level of the bit line voltages VBL of the bit line group BLG3 is 0V.

Further, the respective high levels of the bit line voltages VBL of the bit line groups may be between 0V and VDD, or even between 0.1V and 1.3V or even between 0V and a voltage which string selected transistors (MOS transistors) of the string selected line SSL are able to pass.

The above embodiments of the application may be applied in 2 dimension (2D) or 3D NAND flash memory. Besides, the above embodiments of the application may be applied in SLC (single level cell), MLC (multi-level cell), TLC (Triple-level cell) or QLC (quad-level cell).

In summary, in the above embodiments of the application, based on the locations of the bit lines of the bit line groups on the word lines, the high level and the high level transition time of the bit line voltages applied to the selected bit lines may be adjusted, and thus the memory cells may have the approximate program speed (that is, the memory cells close to the head of the word lines and the memory cells close to the end of the word lines may have the approximate program speed). Thus, by the above embodiments of the application, the dumb program distribution may be narrowed and the memory device may have improved performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device having a memory array including a plurality of memory cells, a plurality of word lines and a plurality of bit lines, the operation method for the memory device including:
    applying a program voltage to at least a selected word line of the word lines; and
    during a high level period of the program voltage, based on respective locations of a plurality of selected bit lines of the bit lines on the word lines, generating and applying a plurality of different bit line voltages to the selected bit lines; the plurality of different bit line voltages generated and applied to the selected bit lines have different rising edges; and in generating the different bit line voltages, the bit line voltage having an earliest rising edge and a highest bit line voltage is generated for applying to a plurality of first selected bit lines of the selected bit lines, which are closest to a head of the word lines, and the plurality of the different bit line voltages are not corresponding to the program voltage.

2. The operation method for the memory device according to claim 1, wherein
    as for the plurality of first selected bit lines and a plurality of second selected bit lines of the selected bit lines, the plurality of first selected bit lines are closer to the head of the word lines than the plurality of second selected bit lines, and
    during the high level period of the program voltage, applying a first bit line voltage of the plurality of different bit line voltages and a second bit line voltage of the plurality of different bit line voltages to the plurality of first selected bit lines and the plurality of second selected bit lines, respectively, wherein a first high level of the first bit line voltage is higher than a second high level of the second bit line voltage, and/or the first bit line voltage has a rising edge earlier than the second bit line voltage.

3. The operation method for the memory device according to claim 2, wherein respective program speeds of the plurality of first selected bit lines and the plurality of second selected bit lines are close to each other.

4. An operation method for a memory device having a memory array including a plurality of word lines and a plurality of bit lines, the bit lines being grouped into a plurality of bit line groups based on respective locations of the bit lines on the word lines, the operation method for the memory device including:
    applying a program voltage to at least a selected word line of the word lines; and
    during a high level period of the program voltage, generating and applying a plurality of different bit line voltages to the selected bit line groups, wherein the plurality of different bit line voltages have different rising edges; and a first selected bit line group of the selected bit line groups, which is closest to a head of the word lines, is applied with the bit line voltage having an earliest rising edge and a highest bit line voltage, and the plurality of the different bit line voltages are not corresponding to the program voltage.

5. The operation method for the memory device according to claim 4, wherein among the selected bit line groups, the first selected bit line group is closer to the head of the word lines than a second selected bit line group, and during the high level period of the program voltage, applying a first bit line voltage of the plurality of different bit line voltages and a second bit line voltage of the plurality of different bit line voltages to the first selected bit line group and the second selected bit line group, respectively, wherein a first high level of the first bit line voltage is higher than a second high level of the second bit line voltage, and/or the first bit line voltage has a rising edge earlier than the second bit line voltage.

6. The operation method for the memory device according to claim 4, wherein each of the bit line groups includes the same number of the bit lines.

7. The operation method for the memory device according to claim 4, wherein each of the bit line groups includes a different number of the bit lines.

8. The operation method for the memory device according to claim 4, wherein during the high level period of the program voltage, respective high levels of the bit line voltages applied to the selected bit line groups are equally distributed between a voltage source and a low level.

9. The operation method for the memory device according to claim 4, wherein during the high level period of the program voltage, respective high levels of the bit line voltages applied to the selected bit line groups are unequally distributed between a voltage source and a low level.

10. The operation method for the memory device according to claim 4, wherein respective program speeds of the plurality of bit line groups are close to each other.

11. A memory device, including:

a memory array including a plurality of memory cells, a plurality of word lines and a plurality of bit lines;

a control circuit coupled to the memory array; and an operation voltage generation circuit, coupled to the memory array and the control circuit, for generating a program voltage to at least a selected word line of the word lines of the memory array;

wherein under control of the control circuit, during a high level period of the program voltage, based on respective locations of a plurality of selected bit lines of the bit lines on the word lines, the operation voltage generation circuit generates and applies a plurality of different bit line voltages to the selected bit lines; the plurality of different bit line voltages have different rising edges; and in generating the different bit line voltages, the bit line voltage having an earliest rising edge and a highest bit line voltage is generated for applying to a plurality of first selected bit lines of the selected bit lines, which are closest to a head of the word lines, and the plurality of the different bit line voltages are not corresponding to the program voltage.

12. The memory device according to claim 11, wherein as for the plurality of first selected bit lines and a plurality of second selected bit lines of the selected bit lines, the plurality of first selected bit lines are closer to the head of the word lines than the plurality of second selected bit lines, and during the high level period of the program voltage, the operation voltage generation circuit applies a first bit line voltage of the plurality of different bit line voltages and a second bit line voltage of the plurality of different bit line voltages to the plurality of first selected bit lines and the plurality of second selected bit lines, respectively, wherein a first high level of the first bit line voltage is higher than a second high level of the second bit line voltage, and/or the first bit line voltage has a rising edge earlier than the second bit line voltage.

13. The memory device according to claim 12, wherein respective program speeds of the plurality of first selected bit lines and the plurality of second selected bit lines are close to each other.

* * * * *